United States Patent [19]

Lawton

[11] Patent Number: 4,608,539
[45] Date of Patent: Aug. 26, 1986

[54] FM DETECTOR WITH INJECTION LOCKED DIVIDER INPUT CIRCUIT

[75] Inventor: Rodney J. Lawton, Wiltshire, England

[73] Assignee: Plessey Overseas Limited, Ilford, England

[21] Appl. No.: 671,948

[22] Filed: Nov. 16, 1984

[30] Foreign Application Priority Data

Nov. 18, 1983 [GB] United Kingdom ............... 8330761
Aug. 17, 1984 [GB] United Kingdom ............... 8421012

[51] Int. Cl.$^4$ .................... H03D 3/02; H04B 1/16; H04B 7/00
[52] U.S. Cl. .................... 329/103; 329/110; 329/137; 455/214; 455/216; 455/312
[58] Field of Search ............... 329/103, 110, 126, 137, 329/140; 455/214, 216, 312

[56] References Cited

U.S. PATENT DOCUMENTS 3,702,442 11/1972 Janssen et al. .................... 329/103
4,509,017 4/1985 Andren et al. .................... 329/137 X

FOREIGN PATENT DOCUMENTS 620668  3/1949 United Kingdom .
627238  8/1949 United Kingdom .
682734 11/1952 United Kingdom .
713915  8/1954 United Kingdom .
771979  4/1957 United Kingdom .

Primary Examiner—Eugene R. LaRoche
Assistant Examiner—D. C. Mis
Attorney, Agent, or Firm—Fleit, Jacobson, Cohn & Price

[57] ABSTRACT

A frequency modulation detection arrangement comprises an FM detector and an injection-locked frequency divider arranged for receiving a radio signal and for providing a frequency divided radio signal in response thereto. The FM detector is coupled with the injection-locked frequency divider for receiving the frequency divided radio signal therefrom and for producing a signal indicative of the information content of the modulating wave of the radio signal.

4 Claims, 3 Drawing Figures

FM DETECTOR WITH INJECTION LOCKED DIVIDER INPUT CIRCUIT

FIELD OF THE INVENTION

This invention relates frequency modulation detectors.

Frequency modulation detectors (hereinafter referred to as FM detectors) which detect signals in fringe frequency modulation reception areas or FM detectors used in space communication frequently operate near to the threshold at which a frequency modulated signal can be detected over the background noise. Hence, the performance of an FM detector which receives a signal of a given signal-to-noise ratio is determined by the noise threshold of the FM detector. If, however, the received signal has a low signal-to-noise ratio and the FM detector is operating near to its noise threshold at this level of signal then a surge in effective noise output power will occur if the signal-to-noise ratio decreases. This surge results in snaps or clicks interfering with detected audio or video signals. These snaps or clicks are due to spikes occurring at random times in the usual background thermal type noise in the frequency modulated signal. A further decrease in the signal-to-noise ratio will increase the number of spikes per second, which will result in further deterioration of the detected audio or visual signal.

DESCRIPTION OF THE PRIOR ART

Hitherto, snaps or clicks in a detected audio or video signal have been reduced by threshold extension techniques which have involved use of phase-lock loops. These suffer from the disadvantage that they are complex in construction since they include expensive non-linear variable capacitance diodes and they have stability problems.

SUMMARY OF THE INVENTION

It is an aim of the present invention to improve the noise threshold of an FM detector so that the number of snaps or clicks in a detected audio or video signal can be significantly reduced for a received frequency modulated signal having a given signal-to-noise ratio.

According to the present invention there is provided a frequency modulation detection arrangement comprising an FM detector and an injection-locked frequency divider arranged for receiving a radio signal and for providing a frequency divided radio signal in response thereto, the FM detector being coupled with the injection-locked frequency divider for receiving the frequency-divided radio signal therefrom and for producing a signal indicative of the information content of the modulating wave of the radio signal.

The injection-locked frequency divider preferably comprises a multiplier and a band-pass filter. The multiplier has an input for receiving the radio signal, and an output which is connected to a second input of the multiplier via the band-pass filter thereby defining a feedback loop.

The FM detector may comprise a phase-sensitive detector which receives the frequency-divided radio signal via first and second signal paths. The second signal path may comprise a phase-quadrature device and a phase-shift means which shifts the phase of the frequency-divided radio signal in dependence upon the modulation thereof.

The FM detector may be coupled to the injection-locked frequency divider either prior to, or after, the band-pass filter of the divider.

Frequency modulation detection arrangements embodying the present invention have the advantage that they reduce the snap or click noise in the output audio or video signal of FM detectors. Additionally, since the detection arrangement of the present invention is effective to divide the frequency of the incoming frequency modulated signal, the arrangement may also be used for translating the carrier frequency of the incoming frequency signal thereby enabling the overall FM detection arrangement to be simplified. Detection arrangements embodying the present invention also have the advantage that there is no interaction between the injection-locked divider and any preceding intermediate frequency filters. Further, such detection arrangements eliminate, or at least reduce, back radiation (i.e. signals transmitted from the injection-locked frequency divider back to any preceding circuits) at intermediate frequencies.

BRIEF DESCRIPTION OF THE DRAWINGS

The invention will now be further described by way of example with reference to the accompanying drawings in which:

FIGS. 1a and 1b show block schematic diagrams of two alternative embodiments of the present invention; and, FIG. 2 shows a circuit diagram of the embodiment shown in FIG. 1a.

DETAILED DESCRIPTION OF THE INVENTION

Figure 1A:
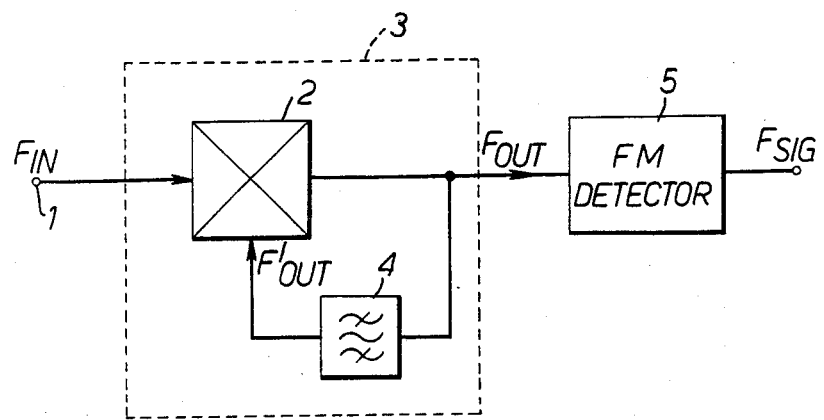

FIG. 1a shows a terminal 1 provided for receiving a frequency modulated intermediate frequency (IF) signal $F_{in}$ containing information embodied in the modulation thereof. The signal $F_{in}$ is fed to a first input of a multiplier 2 of an injection-locked frequency divider 3 where it is multiplied with a signal $F'_{out}$ received at a second input of the multiplier 2 to produce an output signal $F_{out}$ having a magnitude equal to the product of the magnitude of the signal $F_{in}$ and the signal $F'_{out}$. The signal $F_{out}$ is fed back to the second input of the multiplier 2 via a band-pass filter 4. The multiplier 2 and the feedback loop comprising the band-pass filter 4 are operative to frequency divide the signal $F_{in}$ by 2. Hence, the frequencies of the signals $F_{out}$ and $F'_{out}$ are half of the frequency of the signal $F_{in}$. The signal $F_{out}$ is also fed to an FM detector 5 which demodulates the signal $F_{out}$ to produce a signal $F_{sig}$ indicative of the information content of the frequency modulation of the signal $F_{in}$.

When a spike occurs in the signal $F_{in}$, there is a rapid change in phase which corresponds to a large change in frequency. At this point in the signal $F_{in}$, there is also an amplitude drop which releases the injection-locked frequency divider 3. Hence, the divider 3 effectively stops the transmission of spikes.

Figure 1B:
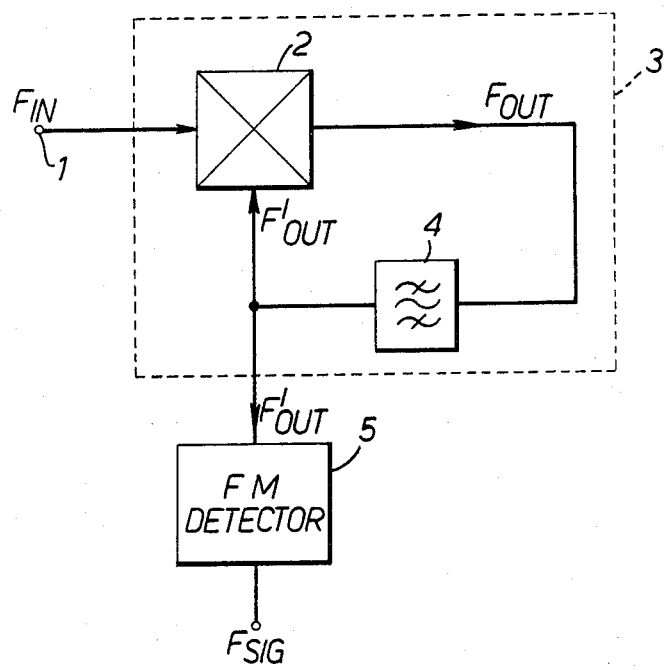

FIG. 1b shows an alternative embodiment of the present invention in which the FM detector 5 is connected to the feedback loop after the signal $F_{out}$ has passed through the band-pass filter 4. In this case, the FM detector 5 demodulates the signal $F'_{out}$ to provide the output signal $F_{sig}$.

Figure 2:
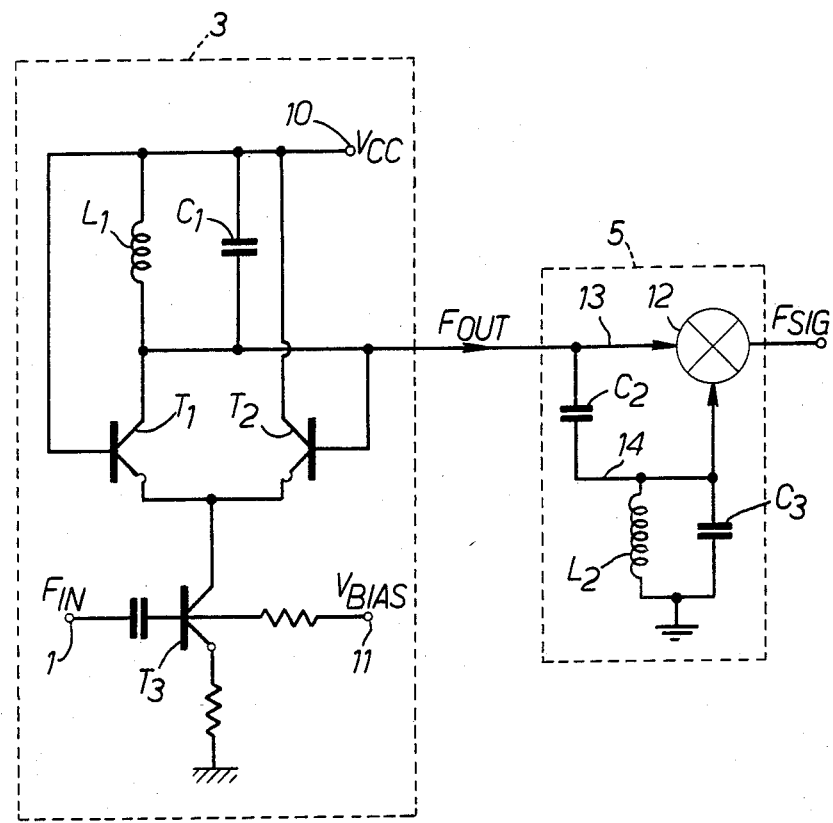

FIG. 2 includes a specific circuit diagram for the injection-locked frequency divider 3 of FIGS. 1a and 1b. In the divider 3 a voltage supply $V_{cc}$ is applied to a terminal 10 and a voltage $V_{bias}$ is applied to a terminal 11 to define a current through the circuit. The signal $F_{in}$ is fed from the terminal 1 to a transistor network T1, T2 and T3 which together form the multiplier 2. An inductor $L_1$ and a capacitor $C_1$ together form the band-pass filter 4. The specific FM detector 5 shown comprises a phase-sensitive detector 12 which is directly coupled to the injection-locked divider 3 via a first path 13, and indirectly coupled via a second path 14 having a phase-quadrature device in the form of a capacitor $C_2$ and a phase-shift means consisting of an inductor $L_2$ and a capacitor $C_3$. The phase-shift means is operative to shift the phase of the signal $F_{out}$ passing through the second path 14 relative to the phase of the signal $F_{out}$ passing through the path 13 in dependence upon any frequency modulation of the signal $F_{in}$. This enables the detector 12 to produce an output signal $F_{sig}$ indicative of the information content of the frequency modulated signal $F_{in}$.

I claim:

1. A frequency modulation (FM) detection arrangement comprising:
   a frequency divider having a multiplier for providing a frequency divided signal in response to a radio signal having a modulating wave thereon received at a first input of said multiplier and in response to said frequency divided signal received, via a band-pass filter, at a second input of said multiplier; and
   an FM detector coupled to said frequency divider and having a phase-sensitive detector for receiving said frequency divided signal via first and second signal paths and for providing a signal indicative of the information content of the modulating wave of said radio signal.

2. A frequency modulation (FM) detection arrangement according to claim 1, wherein said second signal path of said phase-sensitive detector comprises a phase-quadrature device and a phase-shift means which shifts the phase of said frequency-divided radio signal in dependence upon the modulation thereof.

3. A frequency modulation (FM) detection arrangement according to claim 2, wherein said FM detector is coupled to said frequency divider prior to said band-pass filter.

4. A frequency modulation (FM) detection arrangement according to claim 2, wherein said FM detector is coupled to said frequency divider after said band-pass filter.

* * * * *